(12) United States Patent
Umezawa

(10) Patent No.: US 7,480,180 B2
(45) Date of Patent: Jan. 20, 2009

(54) SEMICONDUCTOR MEMORY DEVICE COMPRISING PLURAL SOURCE LINES

(75) Inventor: Akira Umezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 254 days.

(21) Appl. No.: 11/557,255

(22) Filed: Nov. 7, 2006

(65) Prior Publication Data

US 2007/0127294 A1 Jun. 7, 2007

(30) Foreign Application Priority Data

Nov. 11, 2005 (JP) ............................. 2005-327602

(51) Int. Cl.
*G11C 11/34* (2006.01)
(52) U.S. Cl. .............................. 365/185.18; 365/185.29
(58) Field of Classification Search ............ 365/185.18, 365/185.29, 185.26
See application file for complete search history.

(56) References Cited

U.S. PATENT DOCUMENTS 5,633,822 A * 5/1997 Campardo et al. ...... 365/185.02
5,945,717 A * 8/1999 Chevallier ................... 257/390
6,097,636 A * 8/2000 Nojima ................... 365/185.23
6,856,544 B2 * 2/2005 Nakamura ............. 365/185.11

OTHER PUBLICATIONS

Wei-Hua Liu, et al., "A 2-Transistor Source-select (2TS) Flash EEPROM for 1.8V-Only Applications," Non-Volatile Semiconductor Memory Workshop, 4.1, Feb. 1997, 3 pages.

* cited by examiner

*Primary Examiner*—Anh Phung
(74) *Attorney, Agent, or Firm*—Oblon, Spivak, McClelland, Maier & Neustadt, P.C.

(57) ABSTRACT

A semiconductor memory device includes memory cells, bit lines, source lines, and first and second voltage supply circuits. The memory cell includes a MOS transistor. The bit line connects in common drains of the MOS transistors. The source line electrically connects in common sources of the MOS transistors. The first voltage supply circuit applies voltages to the bit lines so that a first potential difference is made between the adjacent bit lines and so that a second potential difference smaller than the first potential difference is made between the bit lines adjacent to each other across the source line. The second voltage supply circuit applies voltages to the source lines so that a third potential difference larger than the second potential difference is made between the source line and bit line adjacent to each other.

20 Claims, 17 Drawing Sheets

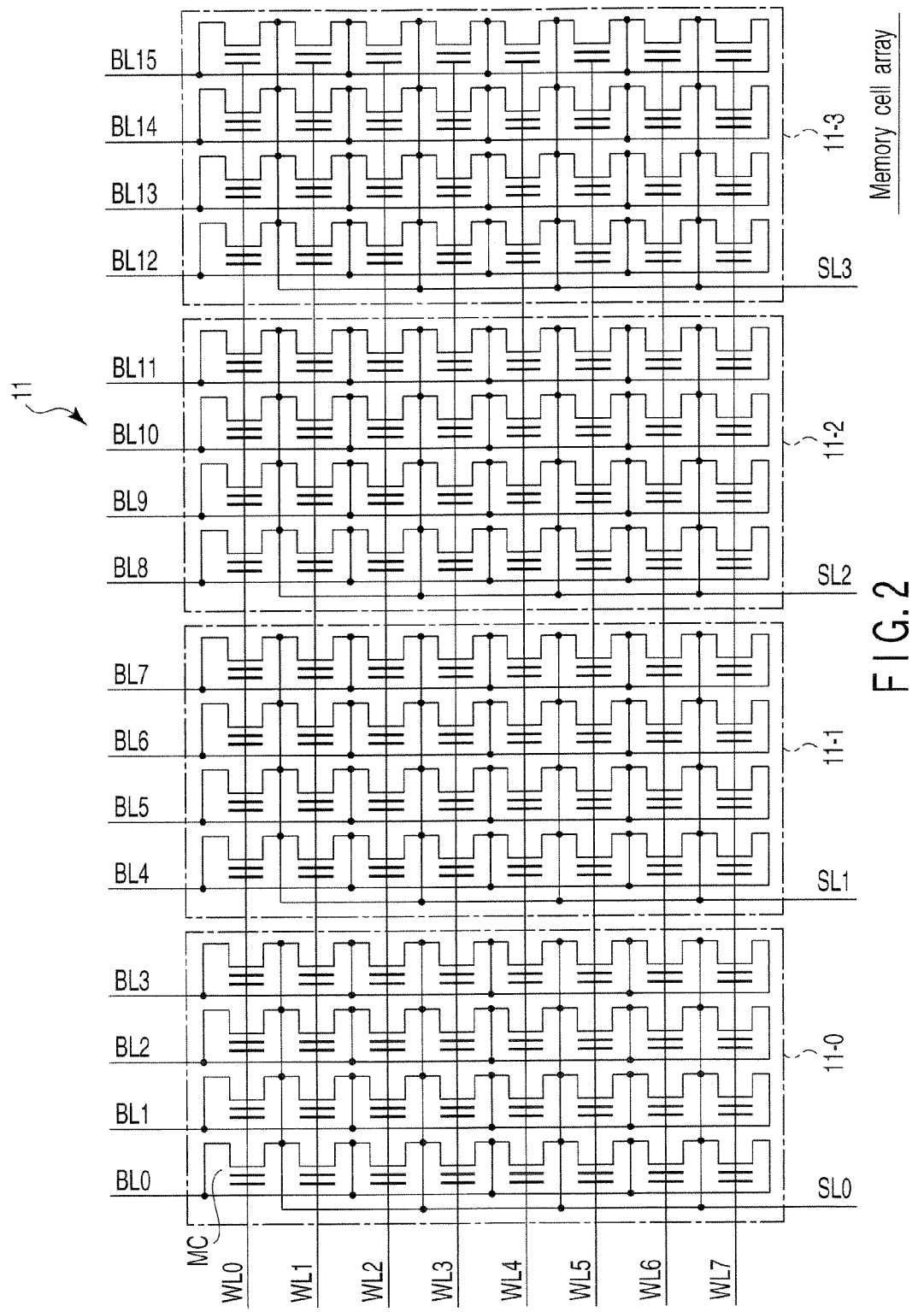
F I G. 2

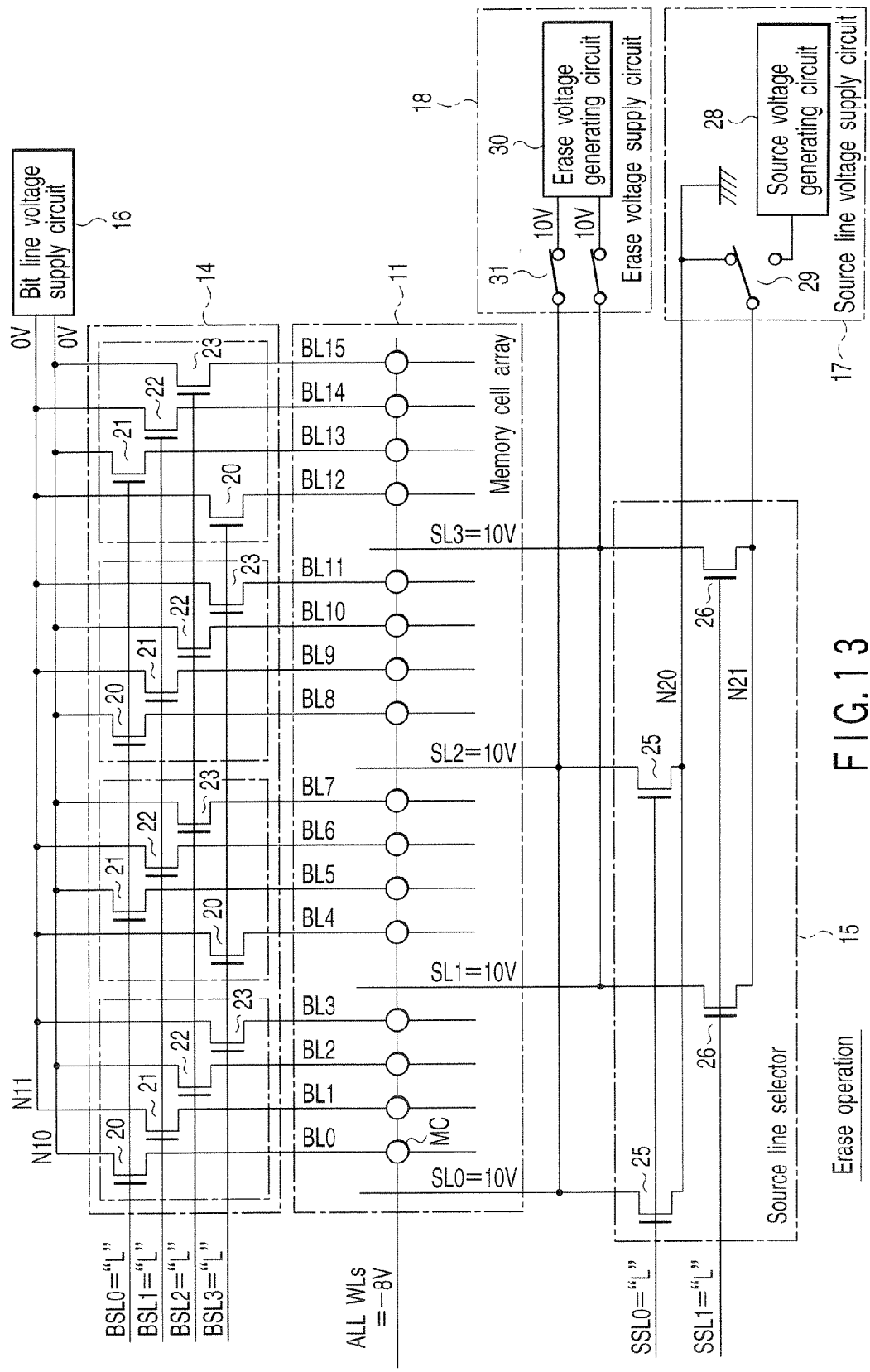
F I G. 13

SEMICONDUCTOR MEMORY DEVICE COMPRISING PLURAL SOURCE LINES

CROSS-REFERENCE TO RELATED APPLICATIONS

This application is based upon and claims the benefit of priority from prior Japanese Patent Application No. 2005-327602, filed Nov. 11, 2005, the entire contents of which are incorporated herein by reference.

BACKGROUND OF THE INVENTION

1. Field of the Invention

The present invention relates to a semiconductor memory device. For example, the present invention relates to a semiconductor memory including MOS transistors each having a floating gate and a control gate.

2. Description of the Related Art

NOR type flash memories and NAND type flash memories have been known and widely used as nonvolatile semiconductor memories. In recent years, a flash memory having the advantages of both NOR type flash memory and NAND type flash memory has been proposed in, for example, Wei-Hua Liu, "A2-Transistor Source-select (2TS) Flash EEPROM for 1.8 V-Only Application", Non-Volatile Semiconductor Memory Workshop 4.1, 1997 (this flash memory is hereinafter referred to as a 2Tr flash memory).

The recent flash memories have been increasingly scaled down. For example, inter-bit-line distance has been reduced. Thus, memory cells are likely to be affected by micro-defects such as dust which may occur between wires during a manufacturing process.

Accordingly, before memories are shipped as products, the memory cells need to be subjected to stress tests. The stress test involves, for example, applying a voltage to between adjacent bit lines or between a bit line and an adjacent source line to check whether or not the memory cell operates correctly. If any defect is occurring, for example, dust is present between the wires, which are thus short circuited, the corresponding memory cell is determined to be defective. An appropriate measure is then taken for this memory cell; it is replaced with a redundant memory cell.

However, the conventional stress test must be conducted for each even-numbered bit line and each odd-numbered bit line or for each even-numbered source line and each odd-numbered source line. This increase the time and cost required for the tests.

BRIEF SUMMARY OF THE INVENTION

A semiconductor memory device according to an aspect of the present invention includes:

memory cells each of which includes a MOS transistor;

a memory cell array in which the memory cells are arranged in a matrix;

word lines each of which connects in common gates of the MOS transistors in the memory cells in the same row;

bit lines each of which connects in common drains of the MOS transistors in the memory cells in the same column;

source lines each of which electrically connects in common sources of the MOS transistors in the memory cells;

a first voltage supply circuit which applies voltages to the bit lines so that a first potential difference is made between the adjacent bit lines and so that a second potential difference smaller than the first potential difference is made between the bit lines adjacent to each other across the source line; and a second voltage supply circuit which applies voltages to the source lines so that a third potential difference larger than the second potential difference is made between the source line and bit line adjacent to each other.

BRIEF DESCRIPTION OF THE SEVERAL VIEWS OF THE DRAWING

FIG. 2 is a circuit diagram of a memory cell array provided in the NOR type flash memory according to the first embodiment of the present invention;

FIG. 13 is a circuit diagram of the NOR type flash memory according to the first embodiment of the present invention, showing how an erase operation is performed;

DETAILED DESCRIPTION OF THE INVENTION

First Embodiment

Figure 1:
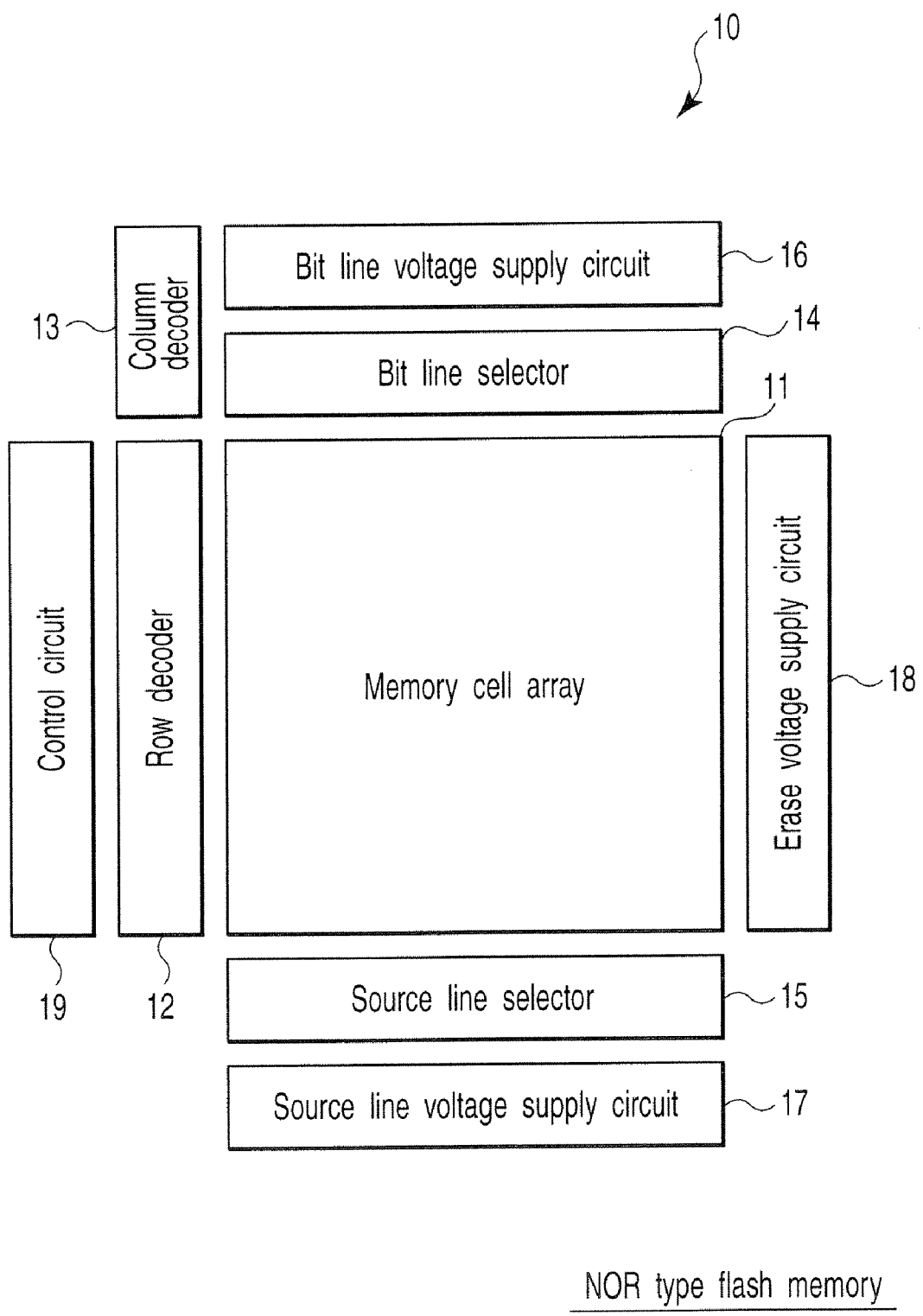
FIG. 1 is a block diagram of a NOR type flash memory according to a first embodiment of the present invention.

With reference to FIG. 1, description will be given of a semiconductor memory device according to a first embodiment of the present invention. FIG. 1 is a block diagram of a NOR type flash memory according to the present embodiment.

As shown in the figure, a flash memory 10 comprises a memory cell array 11, a row decoder 12, a column decoder 13, a bit line selector 14, a source line selector 15, a bit line voltage supply circuit 16, a source line voltage supply circuit 17, an erase voltage supply circuit 18, and a control circuit 19.

The memory cell array 11 comprises a plurality of NOR type flash memory cells arranged in a matrix. Each of the memory cells is connected to a bit line, a word line, and a source line. The row decoder 12 selects a row direction for the memory cell array 11. In other words, the row decoder selects a word line. The column decoder 13 selects a column direction for the memory cell array 11. The bit line selector 15 selects a bit line on the basis of a selecting operation of the column decoder 13. The source line selector 15 selects a source line. The bit line voltage supply circuit 16 supplies a voltage to the bit line. The source line voltage supply circuit 17 supplies a voltage to the source line. The erase voltage supply circuit 18 supplies the source line with an erase voltage used to erase data. The control circuit 19 controls the operation of the circuit block.

Now, the configuration of the memory cell array 11 will be described with reference to FIG. 2. FIG. 2 is a circuit diagram of the memory cell array 11. As shown in the figure, the memory cell array 11 comprises (8×16) memory cells MC. This number of memory cells is only illustrative. The present embodiment is not limited to this number. Each of the memory cells MC is a MOS transistor comprising a stack gate including a charge accumulation layer (for example, a floating gate) and a control gate. The control gates of the memory cells MC in the same row are all connected to the same one of word lines WL0 to WL7. The drains of the memory cells MC in the same row are all connected to the same one of bit lines BL0 to BL15. The sources of every (8×4) memory cells MC are all connected to the same one of source lines SL0 to SL3.

Accordingly, the configuration of the memory cell array 11 can also be described as follows. The memory cell array 11 comprises four memory cell blocks 11-0 to 11-3. Each of the memory cell blocks 11-0 to 11-3 includes (8×4) memory cells MC. For all the memory cell blocks 11-0 to 11-3, the control gates of the memory cells MC in the same row are all connected to one of the word lines WL0 to WL7. The drains of the memory cells MC in the same row are all connected to one of the bit lines BL0 to BL15. The sources of the memory cells MC included in each of the same memory block 11-0 to 11-3 are all connected to the same one of source lines SL0 to SL3.

The memory cell MC connected to a word line WLi (i=0, 1, ... 7) and a bit line BLj (j=0, 1, 2, ... 15) is hereinafter sometimes referred to as a memory cell MC (i, j).

Figure 3:
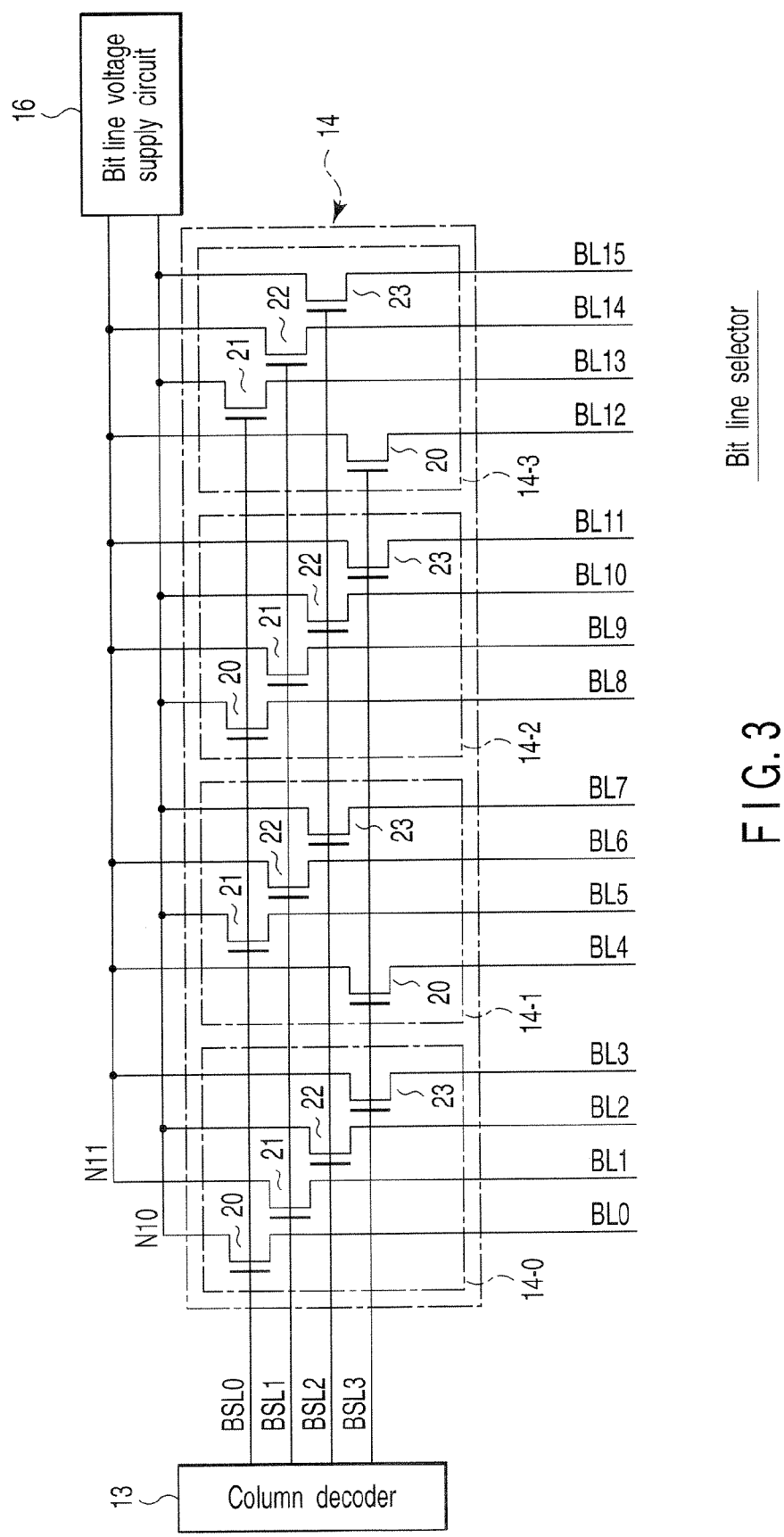
FIG. 3 is a circuit diagram of a bit line selector provided in the NOR type flash memory according to the first embodiment of the present invention.

Now, the configuration of the bit line selector 14 will be described with reference to FIG. 3 that is a circuit diagram of the bit line selector 14. As shown in the figure, the bit line selector 14 comprises select circuits 14-0 to 14-3 each provided for the corresponding memory cell block 11-0 to 11-3. Each of the select circuits 14-0 to 14-3 comprises MOS transistors the number of which is the same as that of bit lines included in the corresponding memory cell block 11-0 to 11-3. In the example in FIG. 3, each of the select circuits 14-0 to 14-3 comprises four MOS transistors 20 to 23. In a select circuit 14-k (k is a natural number of 0 to 3), the MOS transistor 20 has a current path connected to a bit line BL4k at one end. The MOS transistor 21 has a current path connected to a bit line BL (4k+1) at one end. The MOS transistor 22 has a current path connected to a bit line BL (4k+2) at one end. The MOS transistor 23 has a current path connected to a bit line BL (4k+3) at one end.

The other ends of the current paths in the MOS transistors 20 and 22 included in the select circuit 14-l (l is an even natural number; in the example in FIG. 3, l=0 or 2) are connected to the respective other ends of the current paths in the MOS transistors 21 and 23 included in the select circuit 14-(l+1). This common connection node is hereinafter referred to as a node N10. The other ends of the current paths in the MOS transistors 21 and 23 included in the select circuit 14-l are connected to the respective other ends of the current paths in the MOS transistors 20 and 22 included in the select circuit 14-(l+1). This common connection node is hereinafter referred to as a node N11.

A bit line select line BSL0 is connected to both gates of the MOS transistor 20 included in the select circuit 14-l and the MOS transistor 21 included in the select circuit 14-(l+1). A bit line select line BSL1 is connected to both gates of the MOS transistor 21 included in the select circuit 14-l and the MOS transistor 22 included in the select circuit 14-(l+1). A bit line select line BSL2 is connected to both gates of the MOS transistor 22 included in the select circuit 14-l and the MOS transistor 23 included in the select circuit 14-(l+1). A bit line select line BSL3 is connected to both gates of the MOS transistor 23 included in the select circuit 14-l and the MOS transistor 20 included in the select circuit 14-(l+1).

Any of the bit line select lines BSL0 to BSL3 is selected and provided with a voltage by the control circuit 19 or column decoder 13. The nodes N10 and N11 are provided with a voltage by the bit line voltage supply circuit 16.

Figure 4:
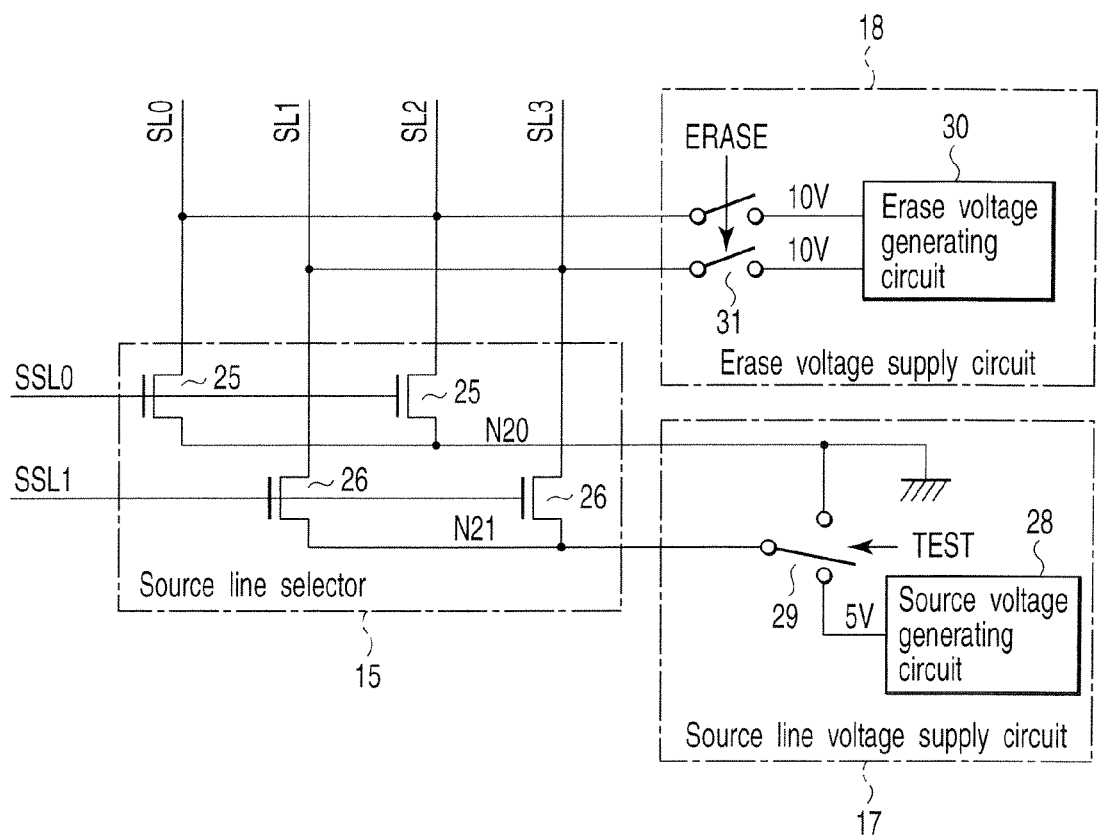
FIG. 4 is a circuit diagram of a source line selector, an erase voltage supply circuit, and a source line voltage supply circuit which are provided in the NOR type flash memory according to the first embodiment of the present invention.

Now, with reference to FIG. 4, description will be given of configurations of the source line selector 15, source line voltage supply circuit 17, and erase voltage supply circuit 18. FIG. 4 is a circuit diagram of the source line selector 15, source line voltage supply circuit 17, and erase voltage supply circuit 18. First, the source line selector 15 will be described. As shown in FIG. 4, the source line selector 15 comprises MOS transistors 25 and 26. The MOS transistor 25 is provided for each source line SLm (m is an even natural number; in the example in FIG. 4, m=0 or 2). The MOS transistor 26 is provided for each source line SL (m+1). One end of the current path in the MOS transistor 25 is connected to the corresponding source line SLm. The other end of the current path is connected to the other MOS transistors 25 (this common connection node is referred to as a node N20). The gate of the MOS transistor 25 is connected to a source line select line SSL0. One end of the current path in the MOS transistor 26 is connected to the corresponding source line SL (m+1). The other end of the current path is connected to the other MOS transistors 26 (this common connection node is referred to as a node N21). The gate of the MOS transistor 26 is connected to a source line select line SSL1. The source line select lines SSL0 and SSL1 are selected and provided with voltages by, for example, the control circuit 19.

Now, the source line voltage supply circuit 17 will be described. As shown in the figure, the source line voltage supply circuit 17 comprises a source voltage generating circuit 28 and a switch element 29. The source voltage generating circuit 28 generates a voltage (for example, 5 V) to be provided to the source line for a stress test. The switch element 29 connects the node N21 in the source line selector 15 to the source voltage generating circuit 28 or ground potential on the basis of a test signal TEST provided by, for example, the control circuit 19. The test signal TEST is asserted for stress tests. The source line voltage supply circuit 17 applies 0 V to the node N20.

Now, the erase voltage supply circuit 18 will be described. As shown in the figure, the erase voltage generating circuit 18 comprises an erase voltage generating circuit 30 and a switch element 31. The erase voltage generating circuit 30 generates a voltage (for example, 10 V) to be provided to the source line for data erasure. The switch element 31 connects any of the source lines SL0 to SL3 to the erase voltage generating circuit 30 on the basis of an erase signal ERASE provided by, for example, the control circuit 19.

Figure 5:
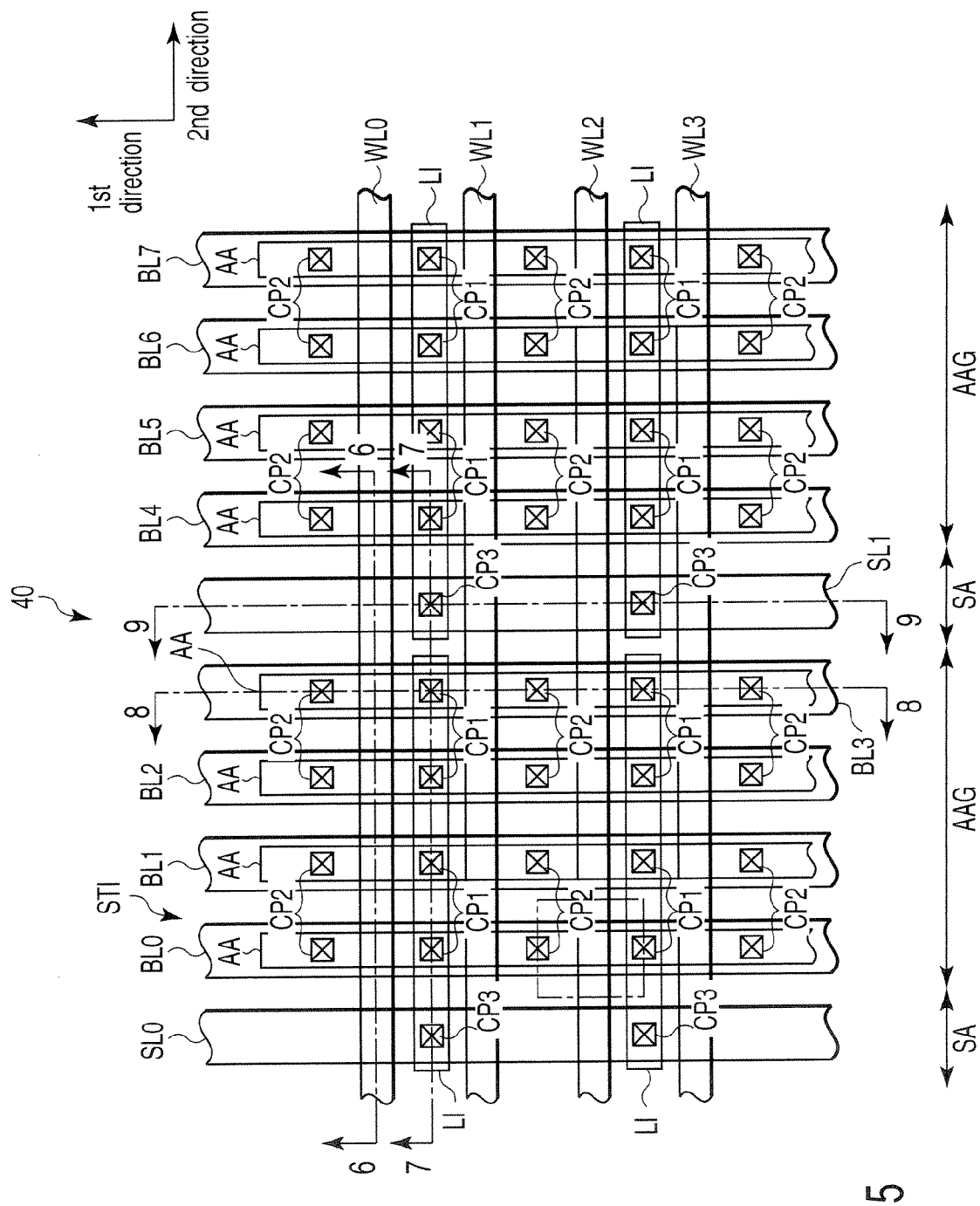
FIG. 5 is a plan view of the memory cell array provided in the NOR type flash memory according to the first embodiment of the present invention.

Now, with reference to FIGS. 5 to 9, the planar and sectional structures of the memory cell array 10 will be described. FIG. 5 is a plan view of partial area of the memory cell array 10. FIGS. 6 to 9 are sectional views taken along lines 6-6, 7-7, 8-8, and 9-9, respectively, in FIG. 5. The erase signal ERASE is asserted for an erase operation.

First, the planar structure will be described with reference to FIG. 5 showing an area containing the bit lines BL0 to BL7, word lines WL0 to WL3, and source lines SL0 and SL1. As shown in the figure, plural striped element areas AA extending along a first direction are formed in a p-type semiconductor substrate 40 along a second direction orthogonal to the first direction. An isolation area STI is formed between the element areas AA to electrically separate the adjacent element areas AA from each other. The striped word lines WL0 to WL3 extending along the second direction are formed to stride over the plural element areas AA. The memory cells MC are formed in areas where the word lines WL0 to WL3 cross the element area AA. Each of the memory cells MC has the MOS transistor comprising the control gate including the floating gate and control gate. The floating gates (not shown) of the memory cells are separated from one another. The control gates of the adjacent memory cells in the second direction are connected together to function as a word line. The adjacent memory cells MC in the first direction share the source or drain of one of them.

A contact plug CP1 is provided on the source of each memory cell MC. A contact plug CP2 is provided on the drain of each memory cell MC. The striped bit lines BL0 to BL7 extending along the first direction each connect together the contact plugs CP2 arranged in the same column along the first direction. Striped local source wires LI each connect four contact plugs CP1 arranged in the same row along the second direction. Striped source lines SL0 and SL1 extending along the first direction are arranged parallel to the bit lines so as to connect together the plural local source lines LI in the same column.

In this configuration, an area in the cell array in which four bit lines BL forms a mass is referred to as an element area group AAG. Any of the memory cell blocks 11-0 to 11-3 is formed in each element area group AAG. That is, the memory cell array 10 has four element area groups AAG in which the bit lines BL0 to BL3, BL4 to BL7, BL8 to BL11, and BL12 to BL17, respectively, are provided. Accordingly, one element area group AAG contains four element areas AA arranged at equal intervals.

Shunt areas SA are each provided adjacent to the element area group AAG. Although the word lines are also formed on the shunt area SA, the word lines present within the shunt area SA do not form a memory cell. The local source wire LI is drawn out from the element area group AAG to the shunt area SA. The adjacent element area groups AAG have separate local source wires LI. That is, each local source wire LI connects together the sources of the memory cells present only in a particular element source group AAG. The local source wire LI is connected, within the shunt area SA, to one of the source lines SL0 to SL3 via contact plugs CP3. Consequently, the sources of the memory cells MC in the same memory cell block are connected together, whereas the sources of the memory cells in one memory cell block are electrically separated from the source of the memory cells in another memory cell block.

Now, the sectional structure of the memory cell array 10 will be described. First, with reference to FIGS. 6 to 8, the configuration of the element area group AAG will be described. As shown in the figures, an isolation area STI is formed in a surface area of a p-type semiconductor substrate 40 and surrounds each element area AA. A gate insulating film 41 is formed on the element area AA of the semiconductor substrate 40. A gate electrode of the memory cell MC is formed on the gate insulating film 41. The gate electrode of the memory cell MC has a polycrystalline silicon layer 42 formed on the gate insulating film 41, a inter-gate insulating film 43 formed on the polycrystalline silicon layer 42, and a polycrystalline silicon layer 44 formed on the inter-gate insulating film 43. The inter-gate insulating film 43 is formed of, for example, a silicon oxide film, or an ON film, an NO film, or an ONO film which is a stack structure of a silicon oxide film and a silicon nitride film.

Figure 6:
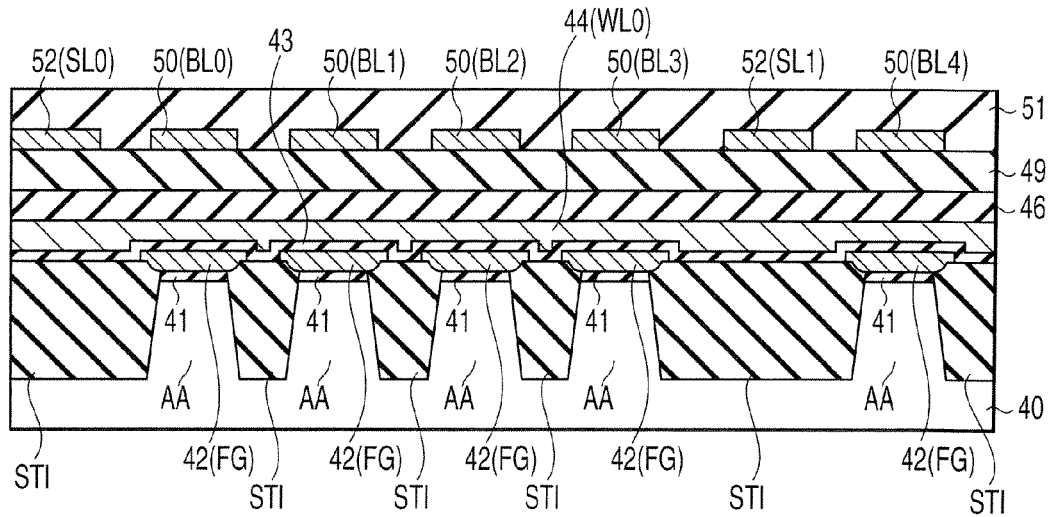
FIG. 6 is a sectional view taken along line 6-6 in FIG. 5.

The polycrystalline silicon layer 42 functions as a floating gate (FG). As shown in FIG. 6, the adjacent polycrystalline silicon layers 42 in the second direction are separated from one another. On the other hand, the adjacent polycrystalline silicon layers 44 in the second direction are connected together and function as a control gate (word line WL). An $n^+$-type impurity diffusion layer 45 is formed in a surface of the semiconductor substrate 40 positioned between the adjacent gate electrodes in the first direction (see FIGS. 7 and 8). The impurity diffusion layer 45 is shared by the adjacent transistors and functions as a source (S) or a drain (D).

An inter-layer insulating film 46 is formed on the semiconductor substrate 40 so as to cover the memory cells MC. The contact plugs CP1 are each formed in the inter-later insulating film 46 so as to reach the impurity diffusion layer (source area) 45 shared by the two memory cells MC (see FIGS. 7 and 8). A metal wiring layer 47 is formed on the inter-layer insulating layer 46 so as to connect to the contact plugs CP1. Contact plugs CP4 are each formed in the inter-later insulating film 46 so as to reach the impurity diffusion layer (drain area) 45 shared by the two memory cells MC (see FIG. 8). A metal wiring layer 48 is formed on the inter-layer insulating layer 46 so as to connect to the contact plugs CP4.

An inter-layer insulating film 49 is formed on the inter-layer insulating film 46 so as to cover the metal wiring layers 47 and 48. Contact plugs CP5 are formed in the inter-layer insulating film 49 so as to reach the respective metal wiring layers 48 (see FIG. 8). The contact plugs CP4 and CP5 and metal wiring layers 48 correspond to the contact plugs CP2 in FIG. 5. A metal wiring layer 50 connected to the plural contact plugs CP5 is formed on the inter-layer insulating film 49. The metal wiring layer 50 functions as the bit line BL. An inter-layer insulating film 51 is formed on the inter-layer insulating film 49 so as to cover the metal wiring layer 50.

Figure 7:
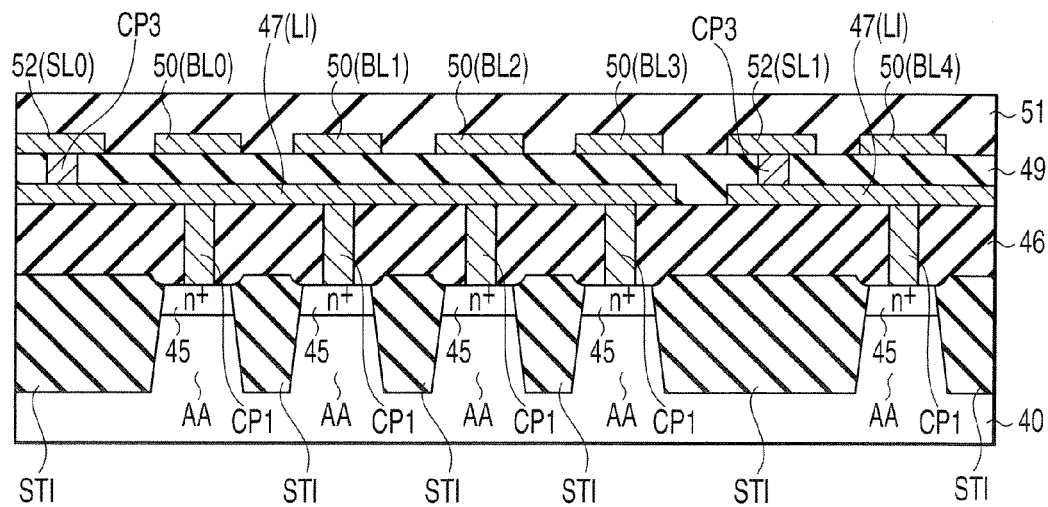
FIG. 7 is a sectional view taken along line 7-7 in FIG. 5.
Figure 8:
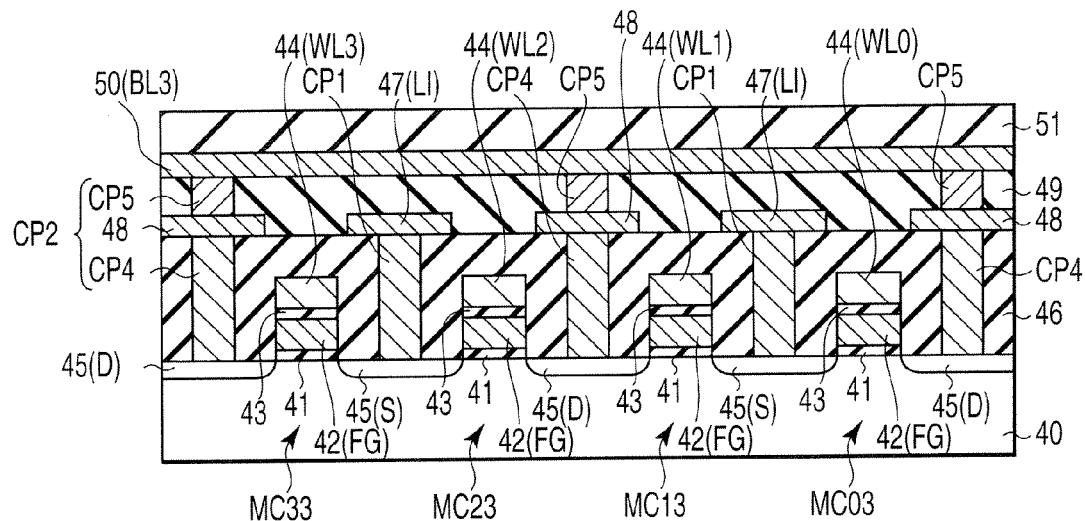
FIG. 8 is a sectional view taken along line 8-8 in FIG. 5.
Figure 9:
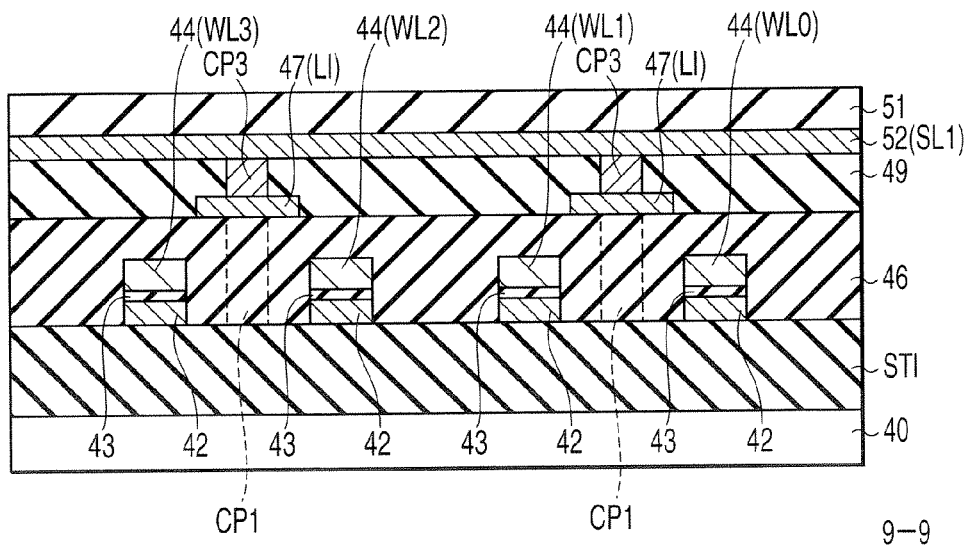
FIG. 9 is a sectional view taken along line 9-9 in FIG. 5.

Now, the sectional structure of the shunt area SA will be described with reference to FIGS. 6, 7, and 9. As shown in the figures, the isolation areas STI are formed in the p-type semiconductor substrate 40. The polycrystalline silicon layers 42 and 44 and the inter-gate insulating film 43 are formed on the isolation areas STI. The inter-layer insulating film 46 is formed so as to cover the polycrystalline silicon layers 42 and 44 and the inter-gate insulating film 43. The metal wiring layer 47 is formed on the inter-layer insulating film 46 to function as the local source wire LI. As previously described, the local source wire LI connects the sources of the memory cells MC together only within the memory cell block. Consequently, the local source wire LI is divided into two portions across the shunt area SA.

The inter-layer insulating film 49 is formed on the inter-layer insulating film 46 so as to cover the metal wiring layer 47. The contact plugs CP3 are formed in the inter-layer insulating film 49 so as to reach the metal wiring layer 47. A metal wiring layer 52 is formed on the inter-layer insulating film 49, that is, at the same level as that of the bit lines, so as to connect the plural contact plugs CP3 together. An inter-layer insulating film 51 is formed on the inter-layer insulating film 49 so as to cover the metal wiring layer 52.

In this configuration, the distance between the adjacent bit lines is equal to the distance between the bit line and source line that are adjacent to each other.

Now, description will be given of operation of the NOR type flash memory configured as described above.

Stress Test Operation

First, a stress test operation will be described. The stress test involves applying a voltage to between the adjacent bit lines or between the adjacent bit and source lines to check whether or not the lines are short circuited by the presence of dust or the like. If short circuiting occurs, the corresponding memory cell is determined to be defective and correspondingly managed.

Figure 10:
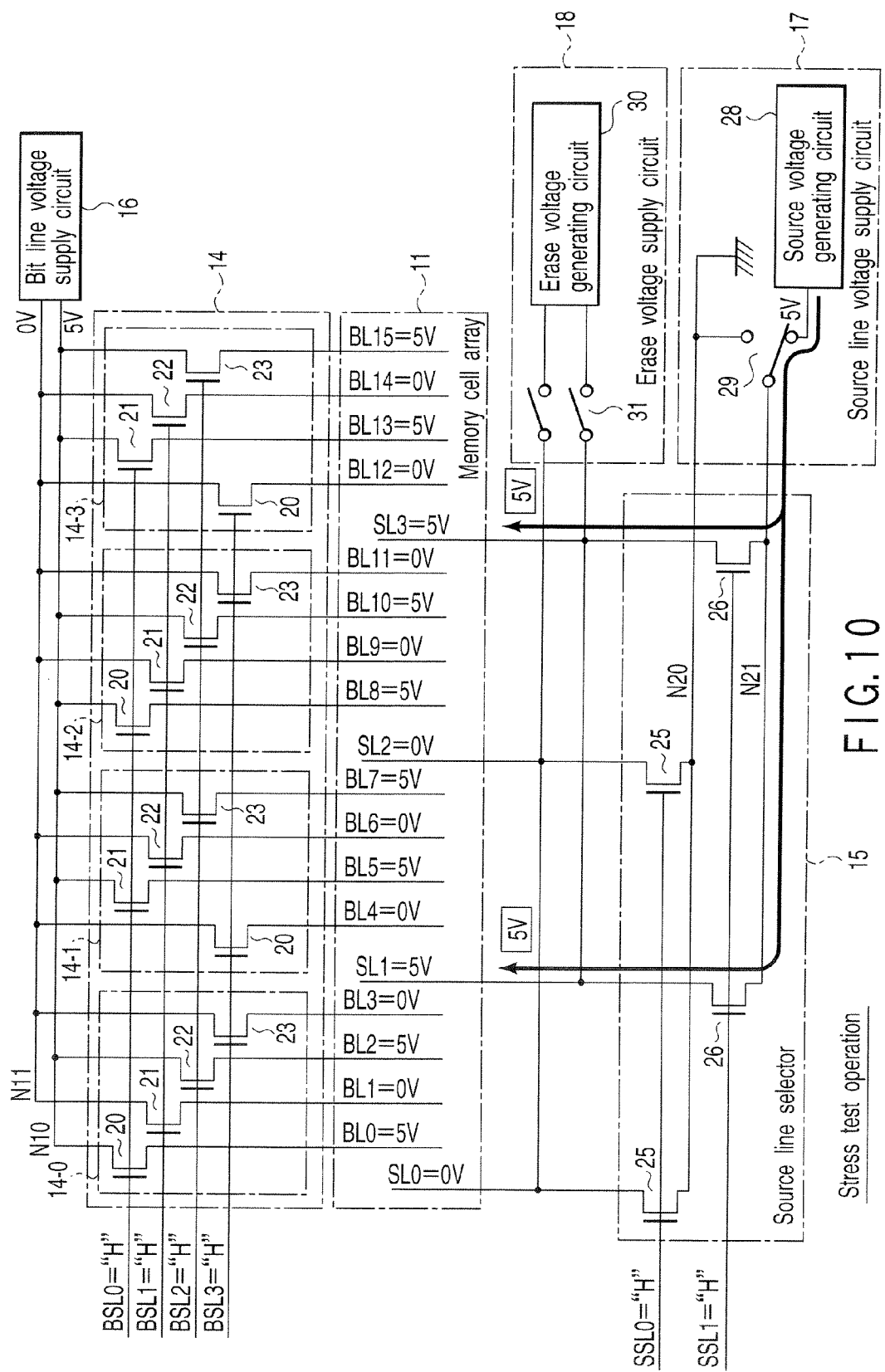
FIG. 10 is a circuit diagram of the NOR type flash memory according to the first embodiment of the present invention, showing how a stress test is performed.

The stress test operation will be described with reference to FIG. 10 that is a circuit diagram showing a NOR type flash memory according to the present embodiment. First, the control circuit 19 (not shown) asserts a test signal TEST, while negating an erase signal ERASE. In response to the test signal TEST, the bit line voltage supply circuit 16 generates a voltage and supplies, for example, 5 V to the node N10 and 0 V to the node N11. The source line voltage generating circuit 28 generates, for example, 5 V. With the test signal TEST asserted, the switch element 29 connects the node N21 to the source line voltage generating circuit 28. Accordingly, the potential of the node N21 in the source line selector 15 is 5 V. On the other hand, the node N20 is provided with 0 V. With the erase signal ERASE negated, the switch element 31 in the erase voltage supply circuit 19 separates the source lines SL0 to S13 from the erase voltage generating circuit 30.

The control circuit 19 selects the bit line select lines BSL0 to BSL3 and the source line select lines SSL0 and SSL1. The control circuit 19 provides these lines with an "H" level signal. This turns on the MOS transistors 20 to 23 in the select circuits 14-0 to 14-3 in the bit line selector 14. The MOS transistors 25 and 26 in the source line selector 15 are also turned on. Consequently, the source lines SL0 and SL2 are provided with 0 V by the source line voltage supply circuit 17 via the node N20. The source lines SL1 and SL3 are provided with 5 V by the source line voltage supply circuit 17 via the node N21. For example, 5 V is provided via the node N10 to two of the bit lines corresponding to the select circuit 14-l (l is a natural number; in the example in FIG. 10; l=0 or 2), the bit lines BL4l and BL (4l+2), and two of the bit lines corresponding to the select circuit 14-(l+1), the bit lines BL (4(l+1)+1) and BL (4(l+1)+3). That is, the potential of each of the bit lines BL0, BL2, BL5, BL7, BL8, BL10, BL13, and BL15 is set to 5 V. For example, 0 V is provided via the node N11 to two of the bit lines corresponding to the select circuit 14-l (l is a natural number; in the example in FIG. 10; l=0 or 2), the bit lines BL (4l+1) and BL (4l+3), and two of the bit lines corresponding to the select circuit 14-(l+1), the bit lines BL (4(l+1)) and BL (4(l+1)+2). That is, the potential of each of the bit lines BL1, BL3, BL4, BL6, BL9, BL11, BL12, and BL14 is set to 0 V.

Thus, a potential difference of 5 V is made between the adjacent bit lines and between the adjacent bit and source lines. Under these conditions, the test checks whether or not the lines are short circuited. If short circuiting occurs, the corresponding memory cell is determined to be defective and correspondingly managed.

Write Operation

Figure 11:
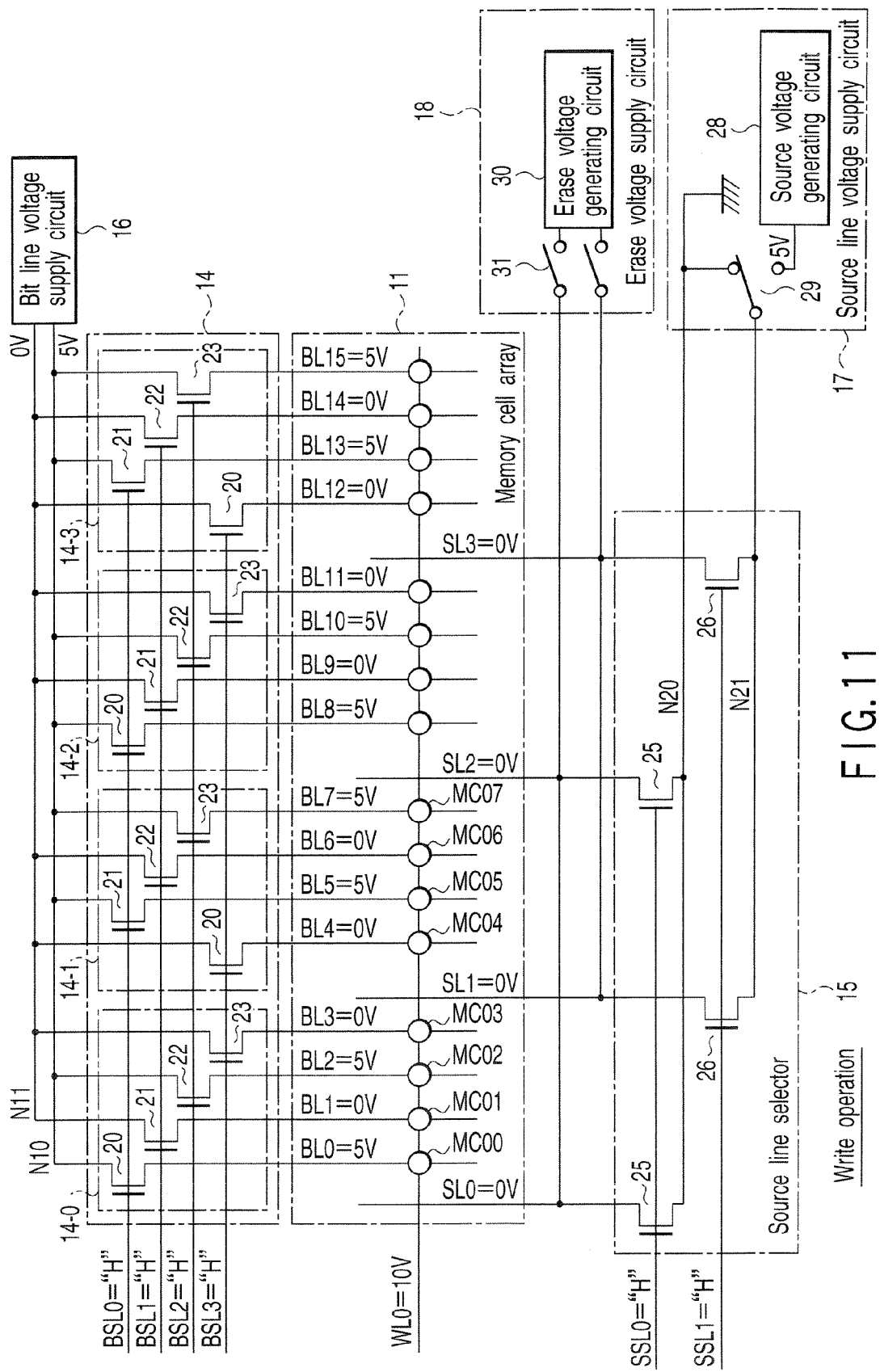
FIG. 11 is a circuit diagram of the NOR type flash memory according to the first embodiment of the present invention, showing how a write operation is performed.

Now, a write operation will be described with reference to FIG. 11 that is a circuit diagram of the NOR type flash memory according to the present embodiment. First, the control circuit 19 (not shown) negates the test signal TEST and erase signal ERASE. Consequently, the node N21 in the source line selector 15 is connected to the ground potential by the switch element 29. The switch element 31 in the erase voltage supply circuit 19 separates the source lines SL0 to SL3 from the erase voltage generating circuit 30. The bit line voltage supply circuit 16 provides write data, that is, 5 V and 0 V to the nodes N10 and N11, respectively.

The control circuit 19 selects the bit line select lines BSL0 to BSL3 and the source line select lines SSL0 and SSL1. The control circuit 19 provides these lines with an "H" level signal. This turns on the MOS transistors 20 to 23 in the select circuits 14-0 to 14-3 in the bit line selector 15. The MOS transistors 25 and 26 in the source line selector 15 are also turned on. Consequently, the source lines SL0 to SL4 are provided with 0 V by the source line voltage supply circuit 17. The bit lines BL0, BL2, BL5, BL7, BL8, BL10, BL13, and BL15 are provided with 5 V via the node N10. The other bit lines are set to have a potential of 0 V. The row decoder 12 selects any of the word lines (in FIG. 11, the word line WL0) and applies, for example, 10 V to the selected word line.

Then, electrons migrate from the source to the drain in the memory cells MC00, MC02, MC05, . . . connected to the word line WL0 and the bit lines BL0, BL2, BL5, BL7, BL8, BL10, BL13, and BL15. Those of the electros which have high energy (hot electrons) reach the floating gate under the effect of electric fields acting toward the gate. Thus, memory cells in a "1" state which have a relatively small number of electrons in the floating gate switch to memory cells in a "0" state which have a relatively large number of electrons. No drain current flows through the other memory cells, the data in which thus remains unchanged.

Read Operation

Figure 12:
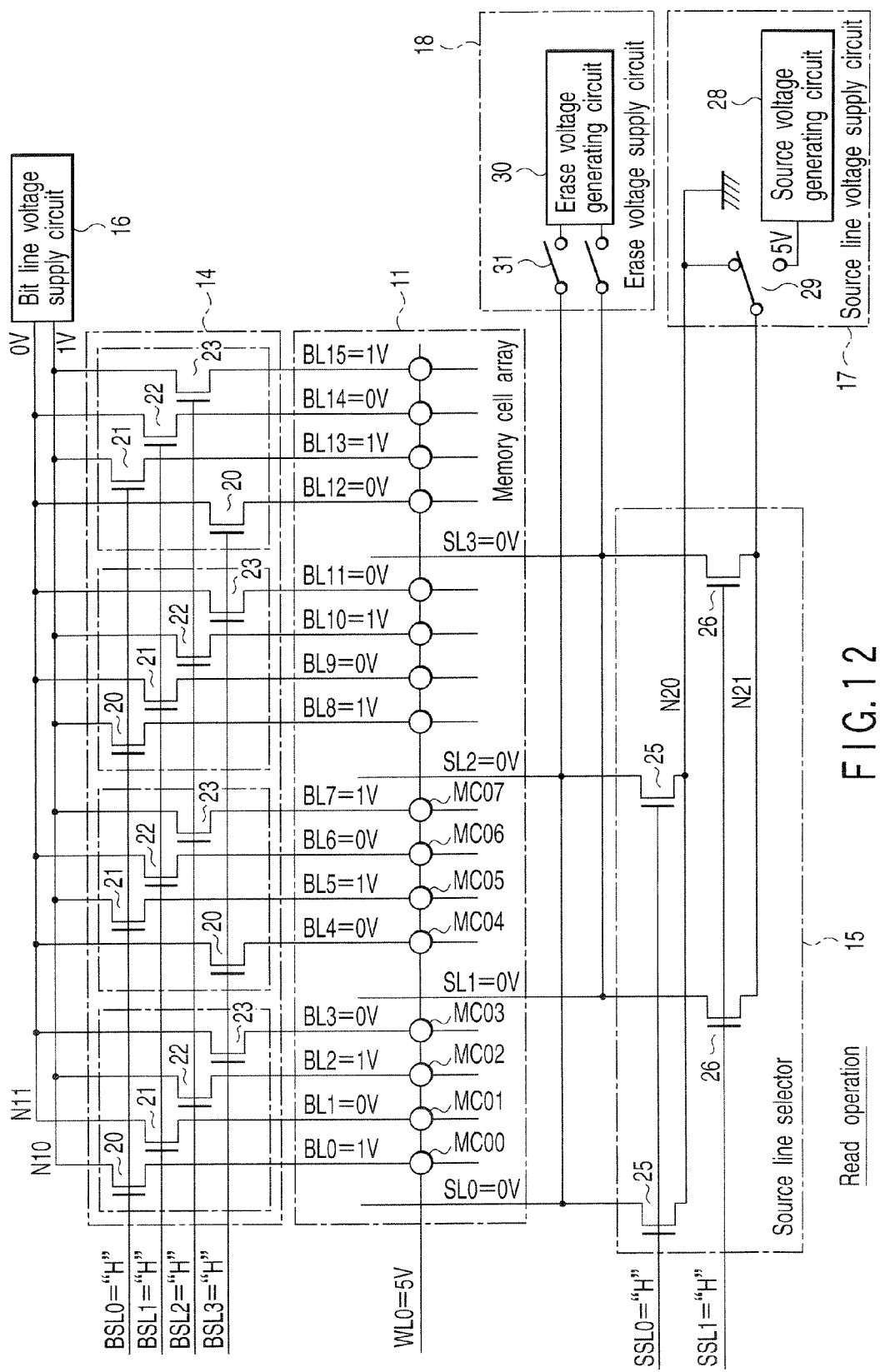
FIG. 12 is a circuit diagram of the NOR type flash memory according to the first embodiment of the present invention, showing how a read operation is performed.

Now, a read operation will be described with reference to FIG. 12 that is a circuit diagram of the NOR type flash memory according to the present embodiment. As is the case with the write operation, the test signal TEST and erase signal ERASE are negated. Consequently, the node N21 is separated from the source voltage generating circuit 28. The source lines SL0 to S13 are separated from the erase voltage generating circuit 30. The bit line voltage supply circuit 16 applies a read voltage, for example, 1 V, to the node N10.

The control circuit 19 selects the bit line select lines BSL0 to BSL3 and the source line select lines SSL0 and SSL1. The control circuit 19 provides these lines with an "H" level signal. Consequently, the source line SL0 to SL4 are provided with 0V by the source line voltage supply circuit 17. The bit lines BL0, BL2, BL5, BL7, BL8, BL10, BL13, and BL15 are provided with 1 V via the node N10. The other bit lines are set to have a potential of 0 V. The row decoder 12 selects any of the word lines (in FIG. 12, the word line WL0) and applies, for example, 5 V to the selected word line.

Then, a current flows through the memory cells in the "1" state but not through the memory cells in the "0" state. Sensing these currents enable data "0" or "1" to be read.

Erase Operation

Now, an erase operation will be described with reference to FIG. 13 that is a circuit diagram of the NOR type flash memory according to the present embodiment. Data erasure is executed on each memory cell array at a time. First, the control circuit 19 (not shown) negates the test signal TEST and asserts the erase signal ERASE. Thus, the node N21 is connected to the ground potential by the switch element 29. The switch element 31 in the erase voltage supply circuit 19 connects the source lines SL0 to SL3 to the erase voltage generating circuit 30. The erase voltage generating circuit 30 generates an erase voltage of, for example, 10 V.

The control circuit 19 unselects all of the bit line select lines BSL0 to BSL3 and source line select lines SSL0 and SSL1. The control circuit 19 provides these lines with an "L" level signal. This turns off the MOS transistors 20 to 23 in the select circuits 14-0 to 14-3 in the bit line selector 15 and the MOS transistors 25 and 26 in the source line selector 15. The row decoder 12 applies, for example, a negative voltage (−8 V), to all the word lines WL0 to WL7. The erase voltage generating circuit 30 applies a positive voltage (10 V) to all the source lines SL0 to SL3.

As a result, high electric fields are applied to the gate insulating film of each memory cell. The electrons in the floating gate migrate to the source under the effect of FN tunneling. The data in the memory cell thus becomes "1".

As described above, the NOR type flash memory according to the first embodiment of the present invention can exert the following effects.

(1) The test costs for the flash memory can be reduced.

The NOR type flash memory according to the present embodiment enables stress tests to be simultaneously carried out on the adjacent bit lines and on the adjacent bit and source lines. This enables the test costs to be reduced. This will be described below in detail.

Figure 14:
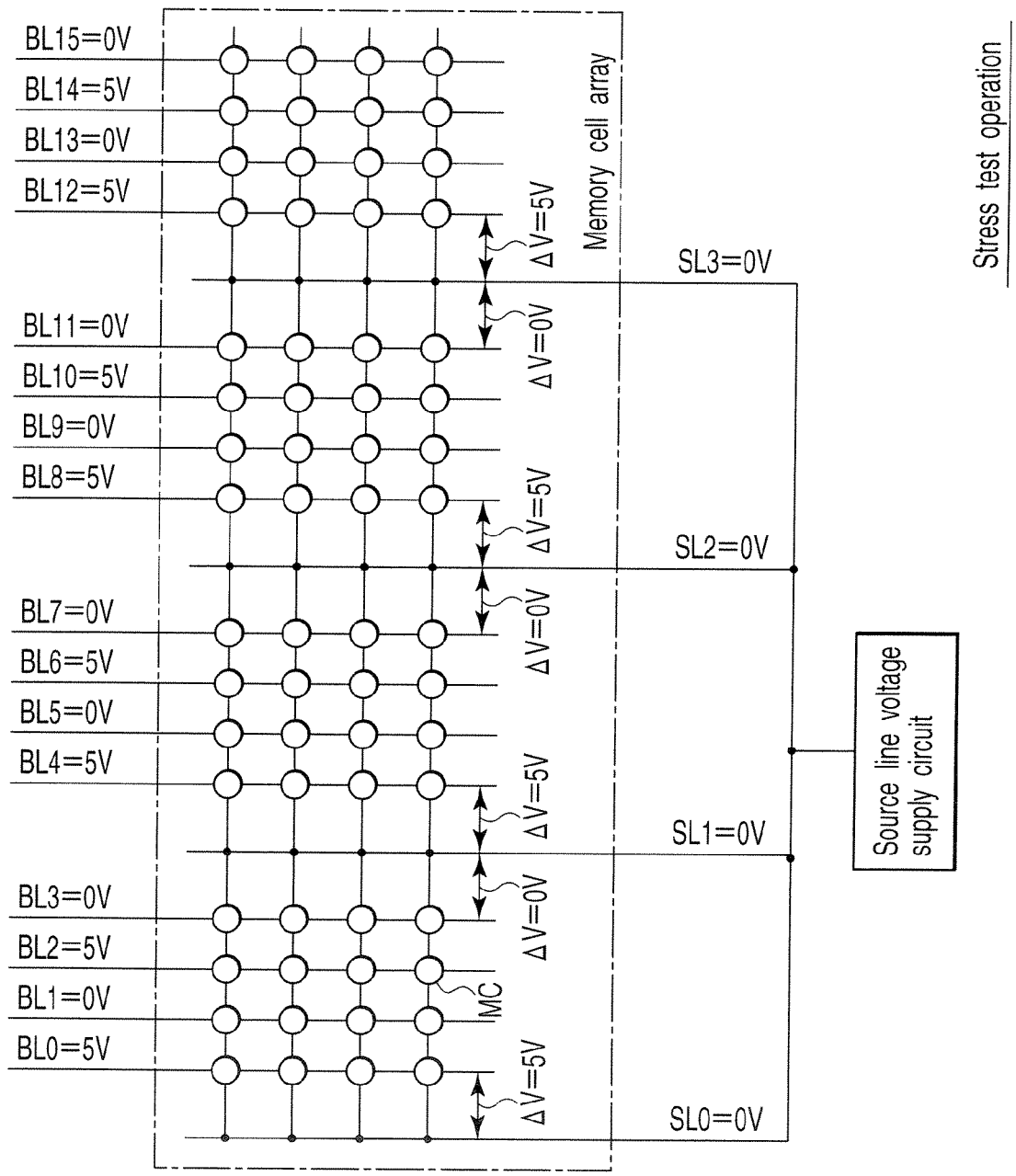
FIG. 14 is a circuit diagram of a NOR type flash memory, showing how a stress test is performed.

FIG. 14 is a circuit diagram of configuration of a conventional flash memory, focusing on the arrangement of the bit lines and source lines. FIG. 14 shows how a stress test is carried out. As shown in the figure, in the conventional configuration, the sources of all the memory cells are connected together. In this configuration, a stress test starts with alternate application of 0V and 5V to the bit lines BL0 to BL15. For example, in the example shown in FIG. 14, 5 V is applied to the even-numbered bit lines (BL0, BL2, BL4, . . . ), while 0 V is applied to the odd-numbered bit lines (BL1, BL3, BL5, . . . ). The application of these voltages results in a potential difference of 5 V between the adjacent bit lines, enabling stress tests.

Further, to carry out a stress test on the source line and bit line, the source lines SL0 to SL3 are subjected to a voltage (0 V). Then, as shown in FIG. 14, a potential difference of 5 V is made between the source line SL0 and the bit line BL0, between the source line SL1 and the bit line BL4, between the source line SL2 and the bit line BL8, and between the source line SL3 and the bit line BL12, to enable stress tests. However, a potential difference of 0 V is made between the source line SL1 and the bit line BL3, between the source line SL2 and the bit line BL7, and between the source line SL3 and the bit line BL11. This prevents stress from being placed between these lines. Accordingly, after the first stress test with 0 V applied to the source lines SL0 to SL3 as shown in FIG. 14, the second stress test needs to be carried out. The second stress test is carried out by applying 5 V to the source lines SL0 to SL3 with the voltages of the bit lines BL0 to BL15 kept unchanged or changing the voltages of the bit lines BL0 to BL15 (applying 0 V to the even-numbered bit lines and 5 V to the odd-numbered bit lines) with the voltages of the source lines SL0 to SL3 kept unchanged.

Alternatively, for example, during the first stress test, 5 V is applied to all the bit lines BL0 to BL15 and 0 V is applied to all the source lines SL0 to SL3 to place stress between the adjacent source and bit lines. Then, 0 V and 5 V are alternately applied to the bit lines BL0 to BL15 to place stress between the adjacent bit lines.

However, whichever method is used, two tests are conventionally required to place stress between the adjacent bit lines and between the adjacent source and bit lines.

In contrast, the flash memory according to the present embodiment requires only one test to place voltage stress between all the adjacent bit lines and between all the adjacent source and bit lines as described with reference to FIG. 10. Consequently, the flash memory according to the present embodiment requires only one stress test, allowing a reduction in the time and cost required for the tests. Thus, the flash memory according to the present embodiment adopts the configuration described below.

First, to allow voltages to be applied to the source lines independently of the bit lines, the local source wires LI are each divided into the portions corresponding to the memory cell blocks 11-0 to 11-3 as described with reference to FIGS. 2 and 5. Then, as described with reference to FIG. 4, the source line selector 15 applies 0 V to the even-numbered source lines SL0 and SL2 via the MOS transistor 25. The source line selector 15 applies 0 V or 5 V to the even-numbered source lines SL1 and SL3 via the MOS transistor 26. This enables the different voltages to be applied to the even-numbered source lines SL0 and SL2 and to the odd-numbered source lines SL1 and SL3.

Then, the same voltage can be applied to the two bit lines adjacent to each other across the source line. As described with reference to FIGS. 3 and 10, the bit line voltage supply circuit 16 applies 0 V and 5 V to the nodes N10 and N11. The bit line selector 14 alternately applies 5 V and 0 V to the bit lines BL0 to BL15, while setting the same voltage on the two bit lines adjacent to each other across the source line. That is, if in a certain memory cell block, 5 V is applied to the even-numbered bit lines, while 0 V is applied to the odd-numbered bit lines, then in another adjacent memory cell block, 5 V is applied to the odd-numbered bit lines, while 0 V is applied to the even-numbered bit lines. FIGS. 3 and 10 show that one memory cell block contains an even number of bit lines. However, the above description refers to the case where one memory cell block contains an odd number of bit lines or where different memory blocks contain different numbers of bit lines.

Since the source lines SL0 to SL3 are used both for a write operation and for a read operation, the source line voltage supply circuit 17 has the switch element 29 so that during a stress test, the MOS transistor 26, which transmits 5 V, can transmit 0 V to the source lines. Further, the switch element 31 allows a high voltage to be applied to the source for an erase operation.

Second Embodiment

Now, description will be given of a semiconductor memory device according to a second embodiment of the present invention. The present embodiment corresponds to the configuration described in the first embodiment and in which data lines are used as the nodes N10 and N11 and in which data lines provide voltages used for stress tests.

Figure 15:
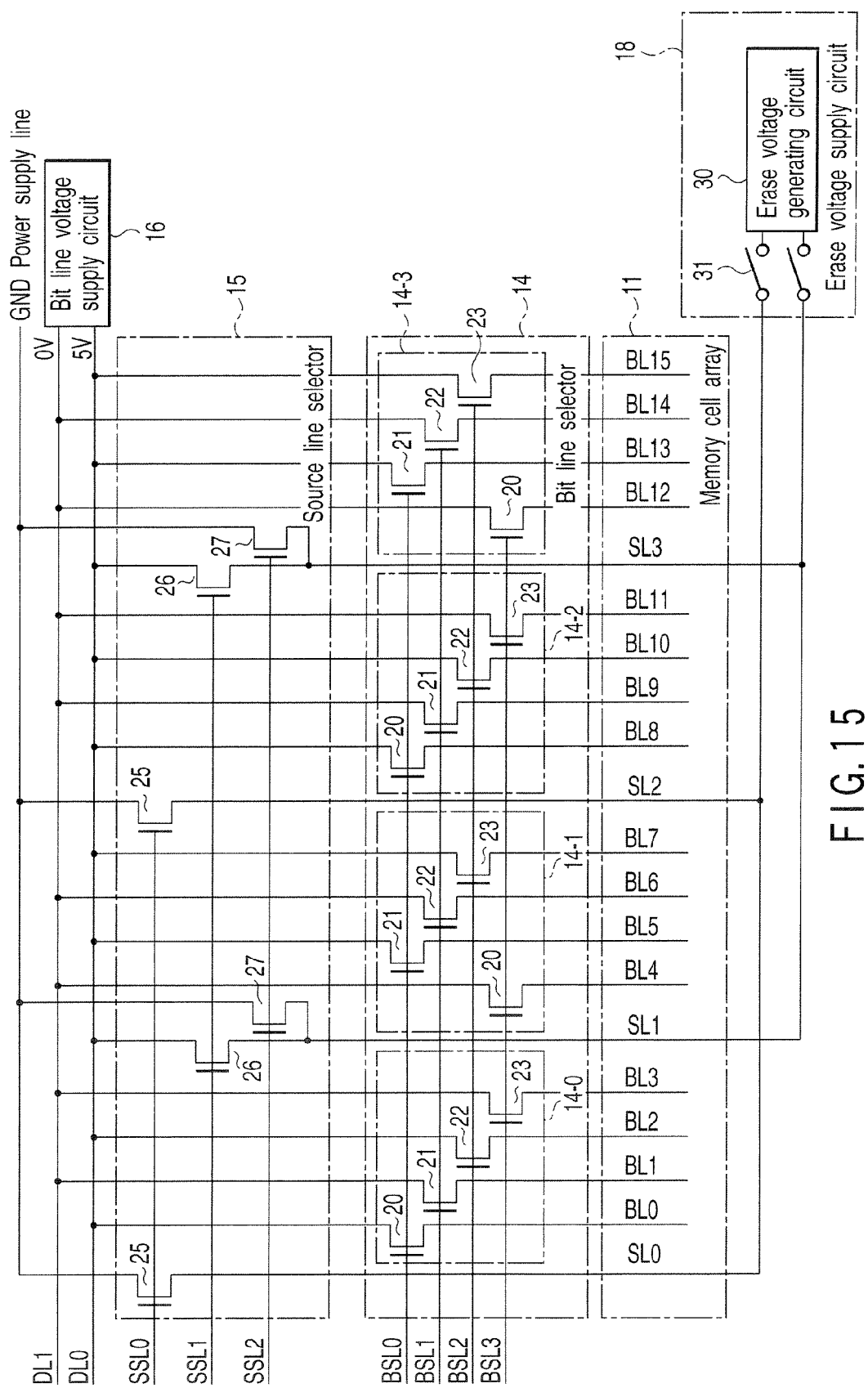
FIG. 15 is a circuit diagram of a NOR type flash memory according to a second embodiment of the present invention.

FIG. 15 is a circuit diagram of a NOR type flash memory according to the present embodiment. Only differences from the first embodiment will be described.

As shown in the figure, the nodes N10 and N11 according to the first embodiment are replaced with data lines DL0 and DL1, respectively. The bit lines BL0 and BL8 are connected to the data line DL0 via the MOS transistor 20. The bit lines BL1 and BL9 are connected to the data line DL1 via the MOS transistor 21. The bit lines BL2 and BL10 are connected to the data line DL0 via the MOS transistor 22. The bit lines BL3 and BL11 are connected to the data line DL1 via the MOS transistor 23. The bit lines BL4 and BL12 are connected to the data line DL1 via the MOS transistor 20. The bit lines BL5 and BL13 are connected to the data line DL0 via the MOS transistor 21. The bit lines BL6 and BL14 are connected to the data line DL1 via the MOS transistor 22. The bit lines BL7 and BL15 are connected to the data line DL0 via the MOS transistor 23.

The source line selector 15 is configured as described in the first embodiment and further comprises MOS transistors 27. The other end of the current path in the MOS transistor 25 is connected to a power supply line (GND line) instead of the node N20. The other end of the current path in the MOS transistor 26 is connected to the data line DL0 instead of the node N21. The MOS transistor 27 is provided for each source line SL (m+1), that is, for each odd-numbered source line. One end of the current path in the MOS transistor 27 is connected to the source line SL (m+1), with the other end connected to the power supply line. The gate of the MOS transistor 27 is connected to a source line select line SSL2 that is selected by the control circuit 19.

The bit line voltage supply circuit 16 applies 5 V and 0 V to the data lines DL0 and DL1. The source line voltage supply circuit is omitted. The other arrangements are similar to those of the first embodiment.

Now, description will be given of operation of a NOR type flash memory according to the present embodiment. Only differences from the first embodiment will be described below.

Stress Test Operation

For a stress test operation, the bit line voltage supply circuit 16 applies 5V and 0 V to the data lines DL0 and DL1, respectively. As a result, 0 V and 5 V are alternately applied to the bit lines BL0 to BL15, with the same voltage set on the two bit lines adjacent to each other across the source line. The control circuit 19 sets the source line select lines SSL0 and SSL1 to the "H" level and the source line select line SSL2 to the "L" level. This turns on the MOS transistors 25 and 26, while turning off the MOS transistors 27. Consequently, the even-numbered source lines SL0 and SL2 are provided with 0 V from the power supply line. The odd-numbered source lines SL1 and SL3 are provided with 5 V from the data line DL0.

Write Operation and Read Operation

For a write operation and a read operation, the control circuit 19 sets the source line select lines SSL0 and SSL2 to the "H" level and the source line select line SSL1 to the "L" level. This turns on the MOS transistors 25 and 27, while turning off the MOS transistors 26. As a result, all the source lines are provided with 0 V through the power source line.

Erase Operation

For an erase operation, the control circuit 19 sets all the source line select lines SSL0 to SSL2 to the "L" level. This turns off all the MOS transistors 25 to 27. The erase voltage generating circuit 30 then provides, for example, 10 V to all the source lines SL0 to SL3.

As described above, the present embodiment can also produce the effect (1), described in the first embodiment, even though it provides the source voltages for a stress test, a write operation, and a read operation through the power supply line and data lines. The present embodiment can also exert the following effect: (2) the source line voltage supply circuit 17 is eliminated to enable the simplification of the circuit configuration.

As described above, the flash memories according to the first and second embodiments of the present invention enable potential differences (voltage stresses) to be simultaneously applied to between the adjacent bit lines and between the adjacent bit and source lines. This makes it possible to simultaneously carry out stress tests on the bit lines and on the source and bit lines. Therefore, the tests costs can be reduced.

Figure 16:
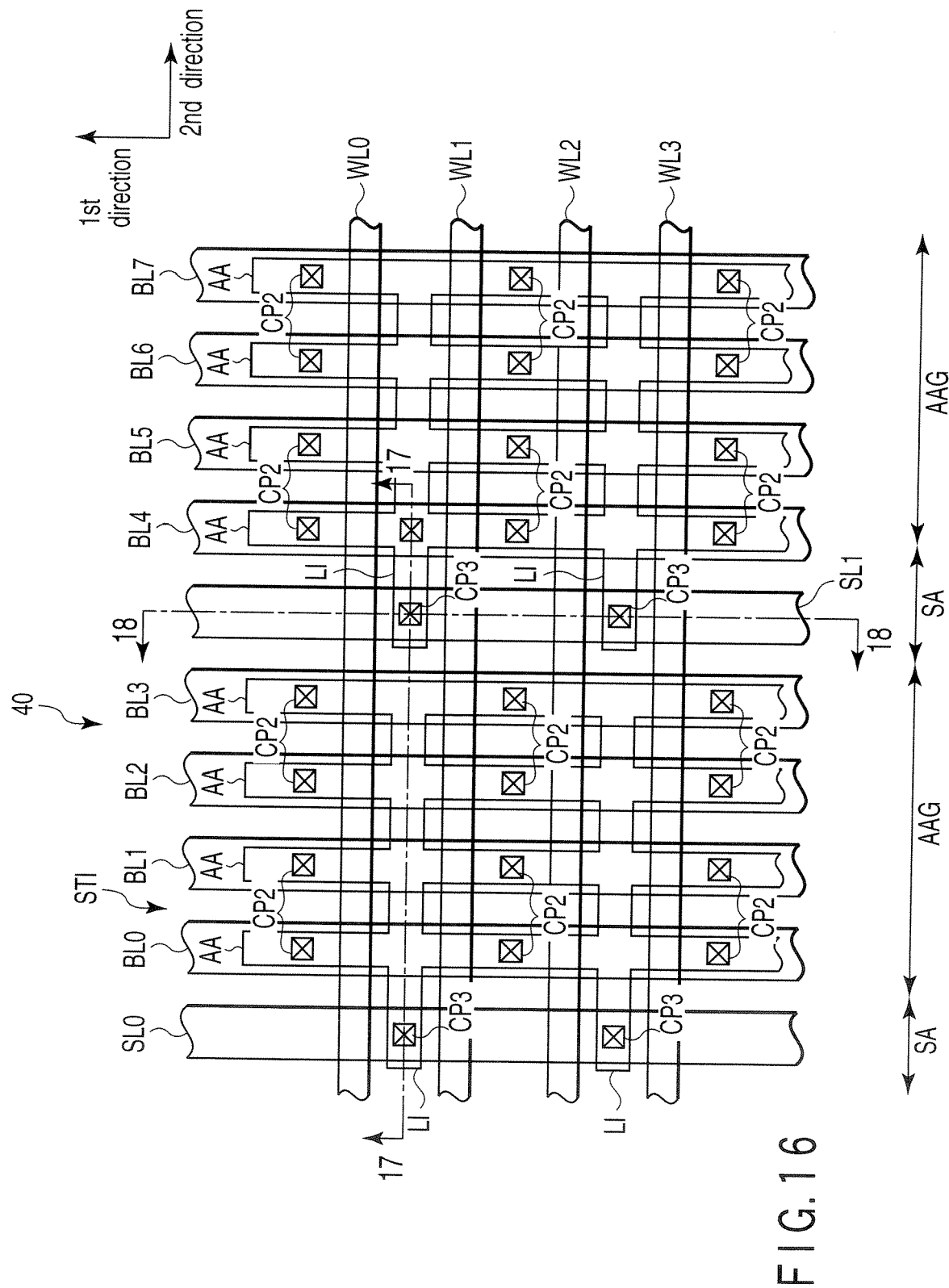
FIG. 16 is a plan view of a memory cell array provided in a NOR type flash memory according to a first variation of the first and second embodiments of the present invention.
Figure 17:
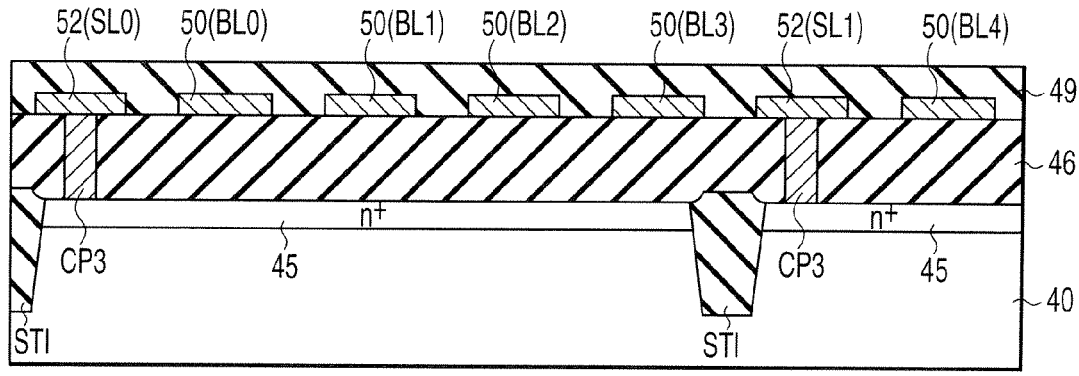
FIG. 17 is a sectional view taken along line 17-17 in FIG. 16.
Figure 18:
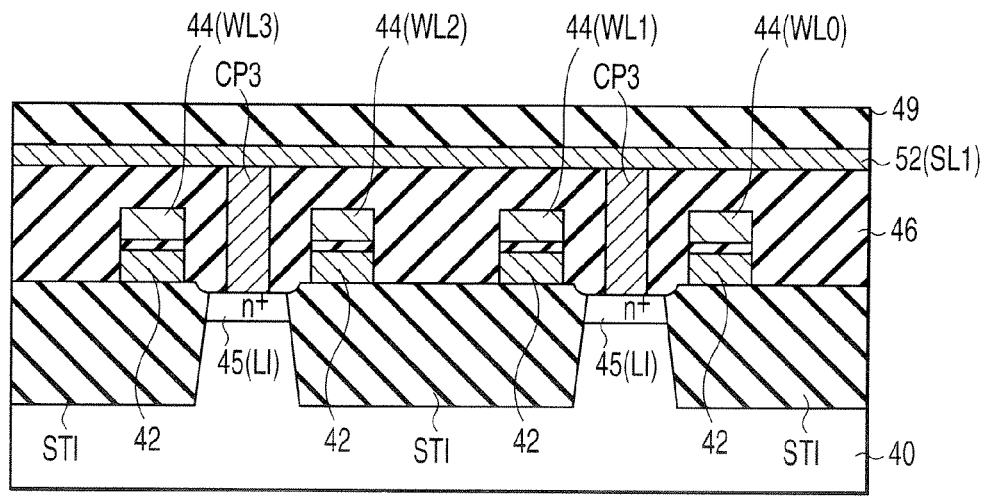
FIG. 18 is a sectional view taken along line 18-18 in FIG. 16.

In the description of the above embodiment, the local source wire LI is formed of the metal wiring layer 47. However, the local source wire LI may be formed of the impurity diffusion layer 45. FIG. 16 is a plan view of a memory cell array in a flash memory according to a first variation of the first and second embodiments. FIG. 16 corresponds to the area shown in FIG. 5. FIGS. 17 and 18 are sectional views taken along lines 17-17 and 18-18, respectively, in FIG. 16. As shown in these figures, in each element area group AAG, the element area AA is also formed between the adjacent sources in the second direction. The $n^+$ type impurity diffusion layer 45 is formed so as to connect the adjacent sources together. That is, the diffusion layer 45 connects the sources of the adjacent memory cells in the second direction together. The diffusion layer 45 functions as the local source wire LI. Further, the contact plugs CP3 are formed on the diffusion layer 45 within the shunt area SA. The metal wiring layer 52 forming the source lines SL is formed on the inter-layer insulating film 46. Of course, the bit lines may also be formed on the inter-layer insulating film 46.

Figure 19:
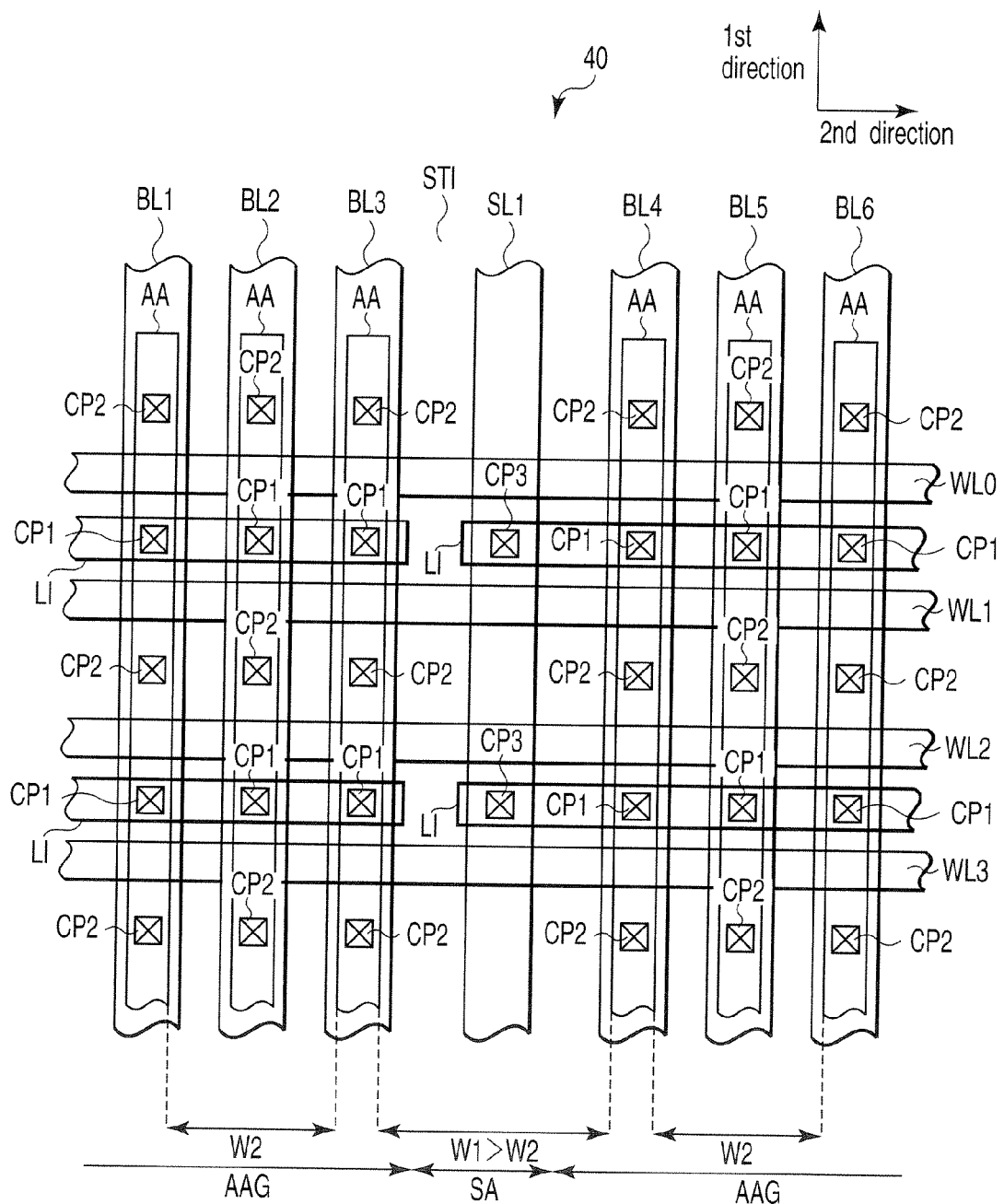
FIG. 19 is a plan view of a memory cell array provided in a NOR type flash memory according to a second variation of the first and second embodiments of the present invention.

As shown in FIG. 19, the shunt area SA may be formed to have a larger width along the second direction. FIG. 19 is a plan view of a memory cell array in a flash memory according to a second variation of the first and second embodiments. FIG. 19 is an enlarged view of the area corresponding to FIG. 5. It is sufficient for the shunt area SA to have, along the second direction, a width required to form the source line SL. Accordingly, the width W1 between the element areas AA immediately below the two bit lines BL3 and BL4 adjacent to each other across the shunt area SA may be equal to a dimension W2 corresponding to the sum of the width of one element area AA and the width of two isolation areas STI within the element area group AAG. However, in the shunt area SA, the local source wire is separated into two portions. Consequently, with the processing margin of a photolithography process taken into account, desirably W1>W2.

Figure 20:
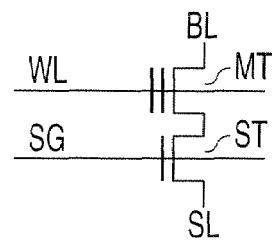
FIG. 20 is a circuit diagram of a memory cell in a 2Tr flash memory.

In the description of the above embodiment, the NOR type flash memories are illustrated. However, the embodiments are also applicable to a flash memory to which data is written by, for example, FN tunneling. For example, the embodiments are also applicable to a 2Tr flash memory as shown in FIG. 20 that is a circuit diagram of a memory cell in a 2Tr flash memory. As shown in the figure, the memory cell comprises a memory cell transistor MT having a drain connected to the bit line BL and a gate connected to the word line WL and a select transistor ST having a drain connected to the source of the memory cell transistor, a source connected to the source line SL, and a gate connected to a select gate line SG.

Figure 21:
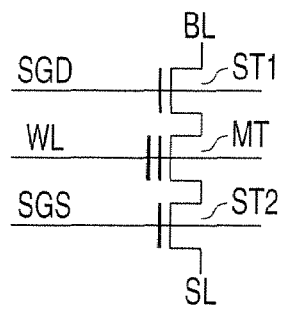
FIG. 21 is a circuit diagram of a memory cell in a 3Tr-NAND type flash memory.

The embodiments are also applicable to a 3Tr-NAND type flash memory as shown in FIG. 21 that is a circuit diagram of a memory cell in a 3Tr-NAND type flash memory. As shown in the figure, this memory cell corresponds to the memory cell in the 2Tr flash memory further comprising a select transistor ST1 having a source connected to the drain of the memory cell transistor MT, a drain connected to the bit line BL, and a gate connected to the select gate line.

Of course, the above embodiments are applicable not only to the flash memories but also to general storage devices, for example, mask ROMs. Further, the voltages applied for stress tests are not limited to 0 V and 5 V. Any appropriate voltages may be used.

Figure 22:
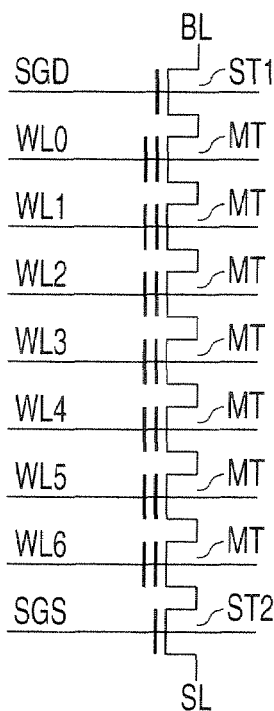
FIG. 22 is a circuit diagram of a memory cell in a NAND type flash memory.

The embodiments are also applicable to a NAND type flash memory as shown in FIG. 22 that is circuit diagram of a memory cell in a NAND type flash memory. As shown in the figure, this memory cell corresponds to the memory cell in the 3Tr-NAND type flash memory in which plural memory cell transistors MT are connected together in series.

In the description of the above embodiments, the bit and source lines are formed of the metal wiring layer at the same level. However, the bit lines and the source lines may be formed of different metal wiring layers. Moreover, the intervals between the bit lines need not be uniform, and the intervals between the adjacent source and bit lines need not be uniform. Furthermore, data may be erased by drawing electrons out of the floating gate to the semiconductor substrate instead of drawing electrons out of the floating gate to the source. In this case, the erase voltage supply circuit 18 applies an erase voltage to the semiconductor substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   memory cells each of which includes a MOS transistor;
   a memory cell array in which the memory cells are arranged in a matrix;
   word lines each of which connects in common gates of the MOS transistors in the memory cells in the same row;
   bit lines each of which connects in common drains of the MOS transistors in the memory cells in the same column;
   source lines each of which electrically connects in common sources of the MOS transistors in the memory cells;
   a first voltage supply circuit which applies voltages to the bit lines so that a first potential difference is made between the adjacent bit lines and so that a second potential difference smaller than the first potential difference is made between the bit lines adjacent to each other across the source line; and
   a second voltage supply circuit which applies voltages to the source lines so that a third potential difference larger than the second potential difference is made between the source line and bit line adjacent to each other.

2. The device according to claim 1, wherein the number of the source lines is n (n is an integer equal to or larger than 2), the second voltage supply circuit applies a first voltage to the 2i-th (i is an integer) source lines and a second voltage different from the first voltage to the (2i+1)-th source lines, and
   the first voltage supply circuit applies the second voltage to the bit lines adjacent to the 2i-th source lines and the first voltage to the bit lines adjacent to the (2i+1)-th source lines.

3. The device according to claim 1, wherein the bit lines and the source lines are formed of a metal wiring layer positioned at a same wiring level.

4. The device according to claim 1, further comprising
   local wires each of which connects in common the sources of the memory cells in the same row in the memory cell array,
   wherein the bit lines and the source lines are formed at a same wiring level and have a striped shape along a column direction in the memory cell array,
   the source lines each connect the local wires together in the column direction, and
   a plurality of the bit lines are positioned between two of the source lines which are close to each other in the row direction.

5. The device according to claim 4, wherein the number of the bit lines positioned between the two source lines which are close to each other in the row direction is the same for any of the source lines.

6. The device according to claim 1, wherein the gate of the memory cell includes a charge accumulation layer and a control gate formed on the charge accumulation layer.

7. A semiconductor memory device comprising:
   memory cells each of which includes a MOS transistor;
   memory cell blocks each of which includes the memory cells arranged in a matrix;
   a memory cell array which includes the memory cell blocks;
   word lines each of which connects in common gates of the MOS transistors in the memory cells in the same row, among a plurality of memory cell blocks;
   bit lines each of which connects in common drains of the MOS transistors in the memory cells in the same column;
   source lines each of which is provided for each of the memory cell blocks and electrically connects in common sources of the MOS transistors in the memory cells included in the corresponding memory cell block;
   a first voltage supply circuit which applies voltages to the bit lines so that a first potential difference is made between the adjacent bit lines in each of the memory cell blocks and so that a second potential difference smaller than the first potential difference is made between the adjacent bit lines included in the respective adjacent memory cell blocks; and
   a second voltage supply circuit which applies voltages to the source lines so that a third potential difference larger than the second potential difference is made between the source line and bit line adjacent to each other.

8. The device according to claim 7, further comprising
   local wires each of which connects in common the sources of the memory cells in the same row in the memory cell block,
   wherein the source line connects the local wires in the corresponding memory cell block together and is formed parallel to the bit lines at an end of the corresponding memory cell block.

9. The device according to claim 7, wherein the number of the source lines is n (n is an integer equal to or larger than 2), the second voltage supply circuit applies a first voltage to the 2i-th (i is an integer) source lines and a second voltage different from the first voltage to the (2i+1)-th source lines, and
   the first voltage supply circuit applies the second voltage to the bit lines adjacent to the 2i-th source lines and the first voltage to the bit lines adjacent to the (2i+1)-th source lines.

10. The device according to claim 7, wherein the bit lines and the source lines are formed of a metal wiring layer positioned at a same wiring level.

11. The device according to claim 8, wherein the bit lines and the source lines are formed at a same wiring level and have a striped shape along a column direction in the memory cell array, and
the bit lines included in one of the memory cell blocks are arranged between the source line included in the same memory cell block and the source line included in the adjacent memory block in the row direction.

12. The device according to claim 11, wherein the memory cell blocks include the same number of the bit lines.

13. The device according to claim 7, wherein the gate of the memory cell includes a charge accumulation layer and a control gate formed on the charge accumulation layer.

14. A semiconductor memory device comprising:
memory cells each of which includes a MOS transistor;
memory cell blocks each of which includes the memory cells arranged in a matrix;
a memory cell array which includes the memory cell blocks;
word lines each of which connects in common gates of the MOS transistors in the memory cells in the same row, among a plurality of memory cell blocks;
bit lines each of which connects in common drains of the MOS transistors in the memory cells in the same column, the bit lines having a striped shape along a column direction;
source lines each of which is provided for each of the memory cell blocks and electrically connects in common sources of the MOS transistors in the memory cells included in the corresponding memory cell block, the source line having a striped shape along the column direction, the source line being sandwiched between one of the bit lines in the corresponding memory cell block and one of the bit lines in the adjacent memory cell block;
a voltage supply circuit which applies voltages to the bit lines so that a first potential difference is made between the adjacent bit lines in each of the memory cell blocks and so that a second potential difference smaller than the first potential difference is made between the adjacent bit lines included in the respective adjacent memory cell blocks; and
a source line selector which connects the source line to the voltage supply circuit or a node providing a first voltage so that a third potential difference larger than the second potential difference is made between the source line and bit line adjacent to each other.

15. The device according to claim 14, further comprising local wires each of which connects in common the sources of a plurality of the memory cells in the same row in the memory cell block,
wherein the source line connects the local wires in the corresponding memory cell block together and is formed parallel to the bit lines at an end of the corresponding memory cell block.

16. The device according to claim 14, wherein the number of the source lines is n (n is an integer equal to or larger than 2),
the source line selector connects the 2i-th (i is an integer) source lines to the node providing the first voltage and connects to the (2i+1)-th source lines to the voltage supply circuit, and
the voltage supply circuit applies a second voltage different from the first voltage to the bit lines adjacent to the 2i-th source lines, applies the second voltage to the (2i+1)-th source lines, and applies the first voltage to the bit lines adjacent to the (2i+1)-th source lines.

17. The device according to claim 14, wherein the bit lines and the source lines are formed of a metal wiring layer positioned at a same wiring level.

18. The device according to claim 15, wherein the bit lines and the source lines are formed at a same wiring level and have a striped shape along a column direction in the memory cell array, and
the bit lines included in one of the memory cell blocks are arranged between the source line included in the same memory cell block and the source line included in the adjacent memory block in the row direction.

19. The device according to claim 18, wherein the memory cell blocks include the same number of the bit lines.

20. The device according to claim 14, wherein the gate of the memory cell includes a charge accumulation layer and a control gate formed on the charge accumulation layer.

* * * * *